(12) United States Patent
Cheng

(10) Patent No.: US 12,495,646 B2
(45) Date of Patent: Dec. 9, 2025

(54) LIGHT EMITTING DEVICE AND METHOD FOR MANUFACTURING THE SAME, TERMINAL DEVICE

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 385 days.

(21) Appl. No.: 18/358,161

(22) Filed: Jul. 25, 2023

(65) Prior Publication Data
US 2024/0072211 A1 Feb. 29, 2024

(30) Foreign Application Priority Data
Aug. 25, 2022 (CN) .......................... 202222250004.8

(51) Int. Cl.
*H10H 20/841* (2025.01)
*H10H 20/01* (2025.01)
*H10H 20/80* (2025.01)
*H10H 20/825* (2025.01)

(52) U.S. Cl.
CPC .... *H10H 20/841* (2025.01); *H10H 20/01335* (2025.01); *H10H 20/862* (2025.01); *H10H 20/034* (2025.01); *H10H 20/825* (2025.01)

(58) Field of Classification Search
CPC ............. H10H 20/841; H10H 29/8421; H10H 20/825; H10H 20/01335; H10H 20/0137; H10H 20/034; H10H 20/01; H10H 29/034; H10H 20/862; H10H 29/862
See application file for complete search history.

(56) References Cited

FOREIGN PATENT DOCUMENTS

CN 106159051 A * 11/2016 ........... H10H 20/814

OTHER PUBLICATIONS

English translation (Year: 2016).*

* cited by examiner

*Primary Examiner* — Latanya N Crawford Eason
(74) *Attorney, Agent, or Firm* — Westbridge IP LLC

(57) ABSTRACT

A light emitting device includes: a substrate; a DBR mask layer on a side of the substrate, the DBR mask layer being provided with a window exposing the substrate, the window including an opening end away from the substrate and a bottom wall end close to the substrate, and on a plane where the substrate is located, an orthographic projection of the opening end falling within an orthographic projection of the bottom wall end; and a light emitting unit. The light emitting unit includes an active layer located on a side, away from the substrate, of the DBR mask layer. Providing the window on the DBR mask layer may reduce dislocation density during epitaxial growth of the light emitting unit, and arrangement of the DBR mask layer may improve light extraction efficiency of the light emitting device.

20 Claims, 5 Drawing Sheets

LIGHT EMITTING DEVICE AND METHOD FOR MANUFACTURING THE SAME, TERMINAL DEVICE

CROSS-REFERENCE TO RELATED APPLICATIONS

The present application claims priority to Chinese Patent Application No. 202222250004.8, filed on Aug. 25, 2022, the entire content of which is incorporated herein by reference.

TECHNICAL FIELD

The present application relates to the field of semiconductor technologies, and in particular, to a light emitting device and a method for manufacturing the same, a terminal device.

BACKGROUND

Gallium nitride (GaN) and its ternary compound aluminum gallium nitrogen (AlGaN) and indium gallium nitrogen (InGaN) have the characteristics of wide band gap and adjustable band gap, and therefore, GaN-based devices have unique advantages in photoelectric applications of ultraviolet light and visible light. GaN-based materials have excellent thermal stability and chemical stability, and strong anti-radiation capability, which enables GaN-based optoelectronic devices to work under extreme conditions. With gradual deepening of applications of the GaN-based materials on the photoelectric devices, demands for dislocation density of the GaN-based materials in terminal devices are further improved.

SUMMARY

In view of this, embodiments of the present application provide a light emitting device and a method for manufacturing the same, a terminal device, to solve problems of high dislocation density in related technologies.

According to a first aspect of the present application, a light emitting device is provided, including: a substrate; a distributed bragg reflector (DBR) mask layer on a side of the substrate, the DBR mask layer being provided with a window exposing the substrate, the window including an opening end away from the substrate and a bottom wall end close to the substrate, and on a plane where the substrate is located, an orthographic projection of the opening end falling within an orthographic projection of the bottom wall end; and a light emitting unit. The light emitting unit includes a first semiconductor layer, an active layer and a second semiconductor layer which are stacked sequentially, a position relationship between the first semiconductor layer and the window includes at least one of the followings: the first semiconductor layer being located in the window or the first semiconductor layer being located on a side, away from the substrate, of the window, the active layer is located on a side, away from the substrate, of the DBR mask layer, the second semiconductor layer is located on a side, away from the substrate, of the active layer, and a conductivity type of the first semiconductor layer is opposite to that of the second semiconductor layer.

In one embodiment, a cross-sectional area of at least part of the window gradually decreases in a direction from the substrate to the opening end.

In one embodiment, along a plane perpendicular to the substrate, a cross-section of the window is formed by a first side, a second side, a third side and a fourth side which are connected in sequence, the first side is located on the opening end, the third side is located on the bottom wall end, a sidewall of the window is formed by the second side and the fourth side, the second side is formed by one or a combination of a straight line or a curve, and the fourth side is formed by one or a combination of a straight line or a curve.

In one embodiment, the DBR mask layer includes: a first mask layer and a first DBR layer which are stacked sequentially, and the first DBR layer is located on a side, away from the substrate, of the first mask layer; the window includes a first window exposing the substrate; and the first window is formed by the first mask layer and includes a first window opening end away from the substrate and a first window bottom wall end close to the substrate, and on the plane where the substrate is located, an orthographic projection of the first window opening end falls within an orthographic projection of the first window bottom wall end.

In one embodiment, in a direction from the substrate to the opening end, a cross-sectional area of the first window gradually decreases, and a cross-sectional area of the window gradually decreases and then remains unchanged.

In one embodiment, the DBR mask layer further includes: a second DBR layer, the second DBR layer is located in the first window, and on the substrate, an orthographic projection of the second DBR layer at least partially overlaps an orthographic projection of the first window opening end.

In one embodiment, on the substrate, an orthographic projection of the first window is completely covered by a combination of orthographic projections of the first DBR layer and the second DBR layer.

In one embodiment, a bottom surface, close to the substrate, of the second DBR layer and the bottom wall end are located in a same plane.

In one embodiment, the light emitting device further includes: a third semiconductor layer between a bottom surface, close to the substrate, of the second DBR layer and the bottom wall end, and the first semiconductor layer is located on a side, away from the substrate, of the third semiconductor layer.

In one embodiment, each of the first DBR layer and the second DBR layer is made of a multi-cycle material, and a number of cycles of the multi-cycle material of the first DBR layer is the same as that of the second DBR layer.

In one embodiment, the multi-cycle material selected for the first DBR layer is different from that for the second DBR layer.

In one embodiment, the first mask layer includes a first sub-mask layer close to the substrate and a second sub-mask layer away from the substrate, the first sub-mask layer is provided with a first sub-window, the second sub-mask layer is provided with a second sub-window, the second sub-window is in communication with the first sub-window, at least part of the window is formed by the second sub-window and the first sub-window, and on the plane where the substrate is located, an area of an orthographic projection of the second sub-window is less than that of the first sub-window.

In one embodiment, the first mask layer is a DBR structure.

In one embodiment, the DBR mask layer includes a plurality of windows, and the plurality of windows are correspondingly provided with a plurality of light emitting units.

In one embodiment, an isolation structure is formed between at least one pair of the plurality light emitting units.

In one embodiment, the light emitting device further includes a third DBR layer on a side, away from the substrate, of the light emitting unit.

According to another aspect of the present application, a method for manufacturing a light emitting device is provided, including: providing a substrate; preparing a DBR mask layer on the substrate; forming a window in the DBR mask layer by using multi-angle dry etching, an angle between an etching direction of the multi-angle dry etching and a plane where the substrate is located being an acute angle; and epitaxially growing a light emitting unit at the window.

In one embodiment, the substrate is exposed by the window, the window includes an opening end away from the substrate and a bottom wall end close to the substrate, and on the plane where the substrate is located, an orthographic projection of the opening end falls within an orthographic projection of the bottom wall end; and the light emitting units includes a first semiconductor layer, an active layer, and a second semiconductor layer which are stacked sequentially, a position relationship between the first semiconductor layer and the window includes at least one of the followings: the first semiconductor layer being located in the window or the first semiconductor layer being located on a side, away from the substrate, of the window, the active layer is located on a side, away from the substrate, of the DBR mask layer, the second semiconductor layer is located on a side, away from the substrate, of the active layer, and a conductivity type of the first semiconductor layer is opposite to that of the second semiconductor layer.

According to another aspect of the present application, a terminal device is provided, including the light emitting device according to any one of the above-mentioned embodiments.

The present application provides a light emitting device and a method for manufacturing the same, a terminal device. The light emitting device includes: a substrate; a DBR mask layer on a side of the substrate, the DBR mask layer being provided with a window exposing the substrate, the window includes an opening end away from the substrate and a bottom wall end close to the substrate, and on a plane where the substrate is located, an orthographic projection of the opening end falling within an orthographic projection of the bottom wall end; and a light emitting unit. The light emitting unit includes a first semiconductor layer, an active layer and a second semiconductor layer which are stacked sequentially, a position relationship between the first semiconductor layer and the window includes at least one of the followings: the first semiconductor layer being located in the window or the first semiconductor layer being located on a side, away from the substrate, of the window, the active layer is located on a side, away from the substrate, of the DBR mask layer, the second semiconductor layer is located on a side, away from the substrate, of the active layer, and a conductivity type of the first semiconductor layer is opposite to that of the second semiconductor layer. Providing the window on the DBR mask layer may reduce the dislocation density during epitaxial growth of the light emitting unit, and arrangement of the DBR mask layer may improve light extraction efficiency of the light emitting device.

DETAILED DESCRIPTION OF THE EMBODIMENTS

The following clearly and completely describes the technical solutions in the embodiments of the present application with reference to the accompanying drawings in the embodiments of the present application. Apparently, the described embodiments are a part of the embodiments of the present application, rather than all the embodiments. Based on the embodiments of the present application, all other embodiments obtained by those of ordinary skill in the art without creative work fall within the protection scope of this application.

In related technologies, it is very difficult to grow a high-quality crystalline material on a heterogeneous substrate, for example, it is more difficult to grow a device-level GaN crystal material on a sapphire substrate. Therefore, it is necessary to design a GaN-based device having a low dislocation density to be applied to the field of photoelectricity, to meet demands of terminal devices for the dislocation density of the GaN-based material.

In order to solve the problems of high dislocation density, the present application provides a light emitting device and a method for manufacturing the same, a terminal device. The light emitting device includes: a substrate; a DBR mask layer on a side of the substrate, the DBR mask layer being provided with a window exposing the substrate, the window including an opening end away from the substrate and a bottom wall end close to the substrate, and on a plane where the substrate is located, an orthographic projection of the opening end falling within an orthographic projection of the bottom wall end; and a light emitting unit. The light emitting unit includes a first semiconductor layer, an active layer and a second semiconductor layer which are stacked sequentially, a position relationship between the first semiconductor layer and the window includes at least one of the followings: the first semiconductor layer being located in the window or the first semiconductor layer being located on a side, away from the substrate, of the window, the active layer is located on a side, away from the substrate, of the DBR mask layer, the second semiconductor layer is located on a side, away from the substrate, of the active layer, and a conductivity type of the first semiconductor layer is opposite to that of the second semiconductor layer. Providing the window on the DBR mask layer may reduce the dislocation density during epitaxial growth of the light emitting unit, and arrangement of the DBR mask layer may improve light extraction efficiency of the light emitting device.

The light emitting device mentioned in this application is further illustrated below in conjunction with FIG. 1 to FIG. 13.

Figure 1:
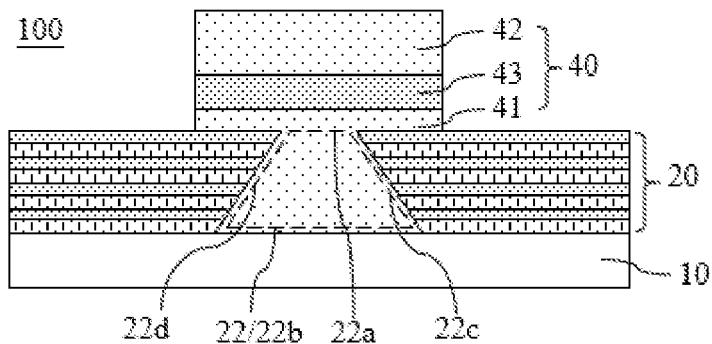
FIG. 1 is a schematic structural diagram of a light emitting device according to an embodiment of the present application.

FIG. 1 is a schematic structural diagram of a light emitting device according to an embodiment of the present application. In one embodiment, as shown in FIG. 1, the present application provides a light emitting device 100, including: a substrate 10; a DBR mask layer 20 on a side of the substrate 10, and a light emitting unit 40. The DBR mask layer 20 is provided with a window 22 exposing the substrate 10, the window 22 includes an opening end 22$a$ away from the substrate 10 and a bottom wall end 22$b$ close to the substrate 10, and on a plane where the substrate 10 is located, an orthographic projection of the opening end 22$a$ falls within an orthographic projection of the bottom wall end 22$b$. The light emitting unit 40 includes a first semiconductor layer 41, an active layer 43, and a second semiconductor layer 42 which are stacked sequentially, a position relationship between the first semiconductor layer 41 and the window 22 includes at least one of the followings: the first semiconductor layer 41 being located in the window 22 or the first semiconductor layer 41 being located on a side, away from the substrate 10, of the window 22, the active layer 43 is located on a side, away from the substrate 10, of the DBR mask layer 20, the second semiconductor layer 42 is located on a side, away from the substrate 10, of the active layer 43, and a conductivity type of the first semiconductor layer 41 is opposite to that of the second semiconductor layer 42.

As shown in FIG. 1, a cross-sectional area of at least part of the window 22 gradually decreases in a direction from the substrate 10 to the opening end 22$a$. The cross-sectional area of the opening end 22$a$ is less than that of the bottom wall end 22$b$, and the window 22 has an open structure with a narrow top and a wide bottom, so that on the plane where the substrate 10 is located, the orthographic projection of the opening end 22$a$ falls within the orthographic projection of the bottom wall end 22$b$. When the first semiconductor layer 41 is located on the side away from the substrate 10, of the window 22, arrangement of the window 22 having the open structure with the narrow top and the wide bottom may reduce a dislocation during epitaxial growth of the first semiconductor layer 41, extend to the, and the dislocation density is reduced by an area of a semiconductor layer extending beyond the DBR mask layer 20. In other words, the window 22 further includes a sidewall 22$c$/22$d$ formed by the DBR mask layer 20, and the sidewall 22$c$/22$d$ is brought together in a direction away from the substrate 10, so that a dislocation at a position where a projection of the sidewall 22$c$/22$d$ on the plane where the substrate 10 is located is highly likely to be blocked to extend through the sidewall 22$c$/22$d$, and a dislocation at a position where a projection of the opening end 22$a$ on the plane where the substrate 10 is located extends upward.

It should be noted that the DBR mask layer 20 includes two types of film layers that are stacked sequentially in a direction perpendicular to a plane where the substrate 10 is located, and have different refractive indexes, and the two film layers may be selected from oxide material pairs including $TiO_2/SiO_2$, $Ti_3O_5/SiO_2$, $Ta_2O_5/SiO_2$, $Ti_3O_5/Al_2O_3$, $ZrO_2/SiO_2$ or $TiO_2/Al_2O_3$. The active layer 43 is located on the side, away from the substrate 10, of the DBR mask layer 20, so that reflectivity of light emitted from the side, away from the substrate 10, of the active layer 43 can be improved, thereby improving light emitting efficiency of the light emitting device 100. It should be noted that, as shown in FIG. 1, a thickness and a relative thickness of each layer structure in the DBR mask layer 20 are not limited in the embodiments of the present application, and in one embodiment, a thickness of a structure, closest to the substrate 10, of the DBR mask layer 20 may be greater than that of each layer structure in the DBR mask layer 20.

Figure 2:
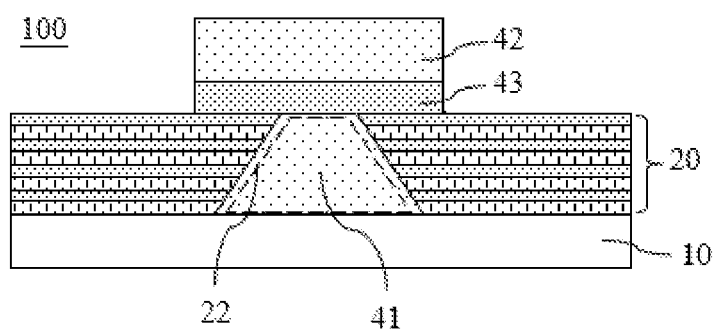
FIG. 2 is a schematic structural diagram of a light emitting device according to an embodiment of the present application.

It should be noted that, in one embodiment, as shown in FIG. 1, the first semiconductor layer 41 is located in the window 22 and located on the side, away from the substrate 10, of the window 22. In another embodiment, as shown in FIG. 2, FIG. 2 is a schematic structural diagram of a light emitting device according to an embodiment of this application, as shown in FIG. 2, a first semiconductor layer 41 is located in the window 22. The first semiconductor layer 41 and other semiconductor structures (not shown) are located in the window 22, and the other semiconductor structures are used to improve epitaxial crystal growth or have other functions, which are not limited in the embodiments of the present application.

In one embodiment, a material of the substrate 10 is at least one of sapphire, silicon carbide, or silicon. In another embodiment, the material of the substrate 10 is a semiconductor material. For example, the substrate 10 may be a buffer layer or a nucleation layer before device structures are epitaxially grown, and the material of the buffer layer or the nucleation layer may include one of aluminum nitride (AlN), AlGaN, or GaN.

In one embodiment, a conductivity type of the first semiconductor layer 41 is an n type, and a conductivity type of the second semiconductor layer 42 is a p type; or, the conductivity type of the first semiconductor layer 41 is a p type, and the conductivity type of the second semiconductor layer 42 is a n type. In one embodiment, the active layer 43 includes a single-quantum well structure or a multi-quantum well structure, which is made of a GaN-based material.

It should be noted that, as shown in FIG. 1, the dashed box is only used for indicating a position of the window 22, and does not represent an entity structure of the window 22. The dashed box in the drawings of the following embodiments is only used for indicating a position of a related window, and details are not described again.

It should be noted that, as shown in FIG. 1, in one embodiment, a method for manufacturing a light emitting device in the embodiments of the present application may include: preparing a sacrificial layer having the same shape as the window 22; depositing a DBR mask layer 20; etching off the sacrificial layer to form the window 22; and epitaxially growing the light emitting unit 40 at the window 22. In another embodiment, a method for manufacturing a light emitting device in the embodiments of the present application may include: preparing the DBR mask layer 20; and forming the window 22 by using multi-angle dry etching, an angle between an etching direction and the plane where the substrate 10 is located being an acute angle.

Figure 3:
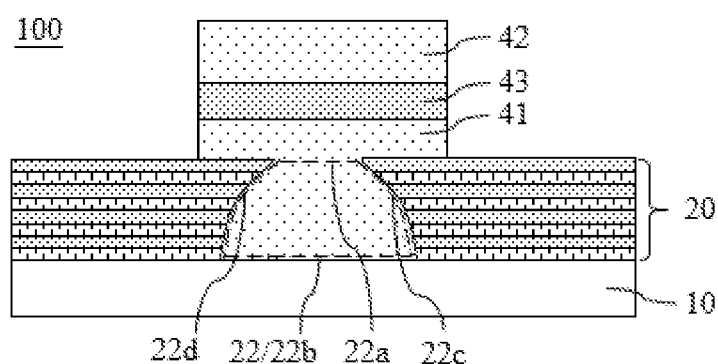
FIG. 3 is a schematic structural diagram of a light emitting device according to an embodiment of the present application.
Figure 4:
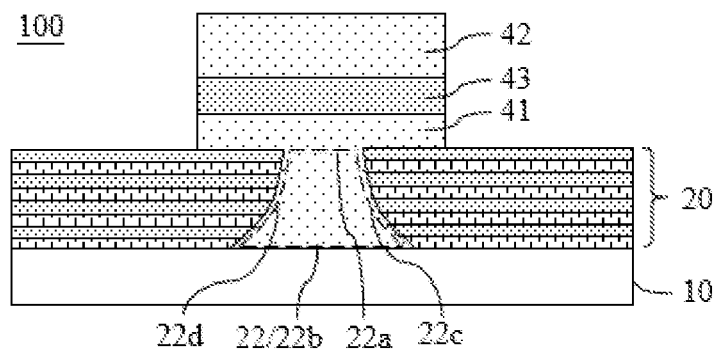
FIG. 4 is a schematic structural diagram of a light emitting device according to an embodiment of the present application.

In one embodiment, FIG. 3 is a schematic structural diagram of a light emitting device according to an embodiment of the present application, FIG. 4 is a schematic structural diagram of a light emitting device according to an embodiment of the present application, as shown in FIG. 1, FIG. 3 and FIG. 4, along a plane perpendicular to the substrate 10, a cross-section of the window 22 is formed by a first side 22a, a second side 22d, a third side 22b and a fourth side 22c which are connected in sequence, the first side 22a is located on the opening end, the third side is located on the bottom wall end, a sidewall of the window 22 is formed by the second side 22d and the fourth side 22c form sidewalls of the window 22, the second side 22d is formed by one or a combination of a straight line or a curve, and the fourth side 22c is formed by one or a combination of a straight line or a curve. As shown in FIG. 1, the second side 22d and the fourth side 22c are both formed by the straight line; and as shown in FIG. 3 and FIG. 4, the second side 22d and the fourth side 22c are both formed by the curve. It should be noted that along the plane perpendicular to substrate 10, the cross-section of the window 22 shown in FIG. 1 to FIG. 4 is a symmetric pattern.

In one embodiment, the lengths of the second side 22d and the fourth side 22c may also not be equal, so the cross-section of the window 22 is an asymmetric pattern. In another embodiment, in the window 22, the second side 22d is formed by a straight line, and the fourth side 22c is formed by a curve (not shown). In another embodiment, in the window 22, the second side 22d is formed by a straight line and a curve, and the fourth side 22c is formed by a straight line and a curve.

Figure 5:
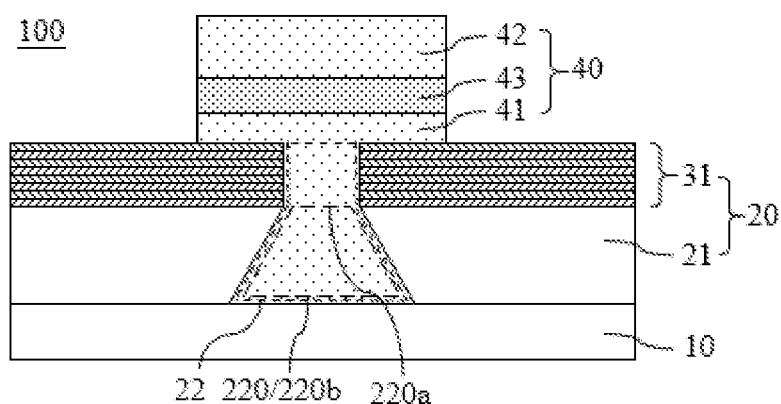
FIG. 5 is a schematic structural diagram of a light emitting device according to an embodiment of the present application.

In one embodiment, FIG. 5 is a schematic structural diagram of a light emitting device according to an embodiment of the present application, as shown in FIG. 5, the DBR mask layer 20 includes: a first mask layer 21, and a first DBR layer 31 which are stacked sequentially, and the first DBR layer 31 is located on a side, away from the substrate 10, of the first mask layer 21; the window 22 includes a first window 220 exposing the substrate 10; and the first window 220 is formed by the first mask layer 21 and includes a first window opening end 220a away from the substrate 10 and a first window bottom wall end 220b close to the substrate 10, and on the plane where the substrate 10 is located, an orthographic projection of the first window opening end 220a falls within an orthographic projection of the first window bottom wall end 220b. Providing the first window 220 on the first mask layer 21 may reduce the dislocation density during the epitaxial growth of the light emitting unit; and arrangement of the first DBR layer 31 may improve the reflectivity of the light emitted from the side, away from the substrate 10, of the active layer 43, thereby improving the light extraction efficiency of the light emitting device 100.

It should be noted that, as shown in FIG. 5, in the direction from the substrate 10 to the opening end 22a, a cross-sectional area of the first window 220 gradually decreases, and a cross-sectional area of the window 22 gradually decreases and then remains unchanged.

Figure 6:
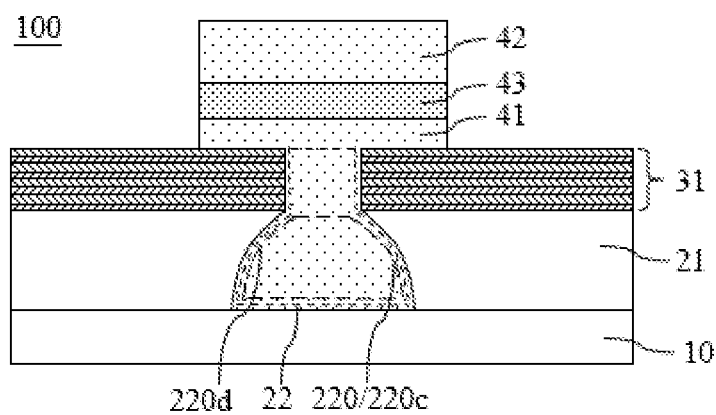
FIG. 6 is a schematic structural diagram of a light emitting device according to an embodiment of the present application.

In one embodiment, FIG. 6 is a schematic structural diagram of a light emitting device according to an embodiment of the present application, as shown in FIG. 6, in a cross-section of the first window 220 along a plane perpendicular to the substrate 10, the sidewall 220c/220d of the first window 220 is formed by the curve, and the second side 22d and the fourth side 22c of the window 22 are formed by the straight line and the curve.

Figure 7:
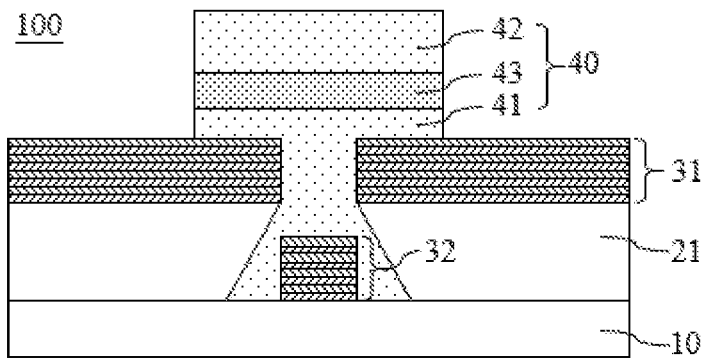
FIG. 7 is a schematic structural diagram of a light emitting device according to an embodiment of the present application.

In one embodiment, FIG. 7 is a schematic structural diagram of a light emitting device according to an embodiment of the present application, as shown in FIG. 7, the DBR mask layer 20 further includes: a second DBR layer 32, the second DBR layer 32 is located in the first window 220, and on the substrate 10, an orthographic projection of the second DBR layer 32 at least partially overlaps an orthographic projection of the first window opening end 220a. Arrangement of the second DBR layer 32 can further reduce a probability of extending upwards of a dislocation at a position where a projection of the opening end 22a on the plane where the substrate 10 is located, thereby reducing the dislocation density. The active layer 43 is located on a side, away from the substrate 10, of the DBR mask layer 31, and a combination of the second DBR layer 32 and the first DBR layer 31 increases an overall reflection area of the DBR mask layer, improving the reflectivity of the light emitted from the side, away from the substrate 10, of the active layer 43, and further improving the light extraction efficiency of the light emitting device 100.

In one embodiment, the orthographic projection, on the plane where the substrate 10 is located, of the second DBR layer 32 is staggered with the orthographic projection of the first window opening end 220a on the substrate 10, that is, a center of gravity of the second DBR layer 32 and a center of gravity of the first window opening end 220a do not coincide.

In one embodiment, the first DBR layer 31 and the second DBR layer 32 are selected from oxide material pairs including $TiO_2/SiO_2$, $Ti_3O_5/SiO_2$, $Ta_2O_5/SiO_2$, $Ti_3O_5/Al_2O_3$, $ZrO_2/SiO_2$ or $TiO_2/Al_2O_3$, and the oxide material pairs are pairs of the multi-cycle material having different refractive indexes. In one embodiment, the material pairs selected for the first DBR layer 31 and the second DBR layer 32 are different.

In one embodiment, as shown in FIG. 7, on the substrate 10, an orthographic projection of the first window 220 is completely covered by a combination of orthographic projections of the first DBR layer 31 and the second DBR layer 32. It should be noted that, the first DBR layer is formed on the first mask layer 21, although the first DBR layer 31 has an opening having a size the same as the first window opening end 220a, on the substrate 10, the orthographic projection of the first window opening end 220a is at least completely covered by the orthographic projection of the second DBR layer 32, and therefore, the orthographic projection of the first window 22 is exactly covered by the orthographic projections of the first DBR layer 31 and the second DBR layer 32, thereby maximizing the overall reflection area of the DBR mask layer, so that the light emitted from the side, toward the substrate 10, of the active layer 43 is reflected out, and the light extraction efficiency of the light emitting device 100 is improved.

In one embodiment, as shown in FIG. 7, a bottom surface, close to the substrate 10, of the second DBR layer 32 and the bottom wall end 22b are located in a same plane. The second DBR layer 32 is formed on the substrate 10, and the second DBR layer 32 is in direct contact to the substrate 10.

Figure 8:
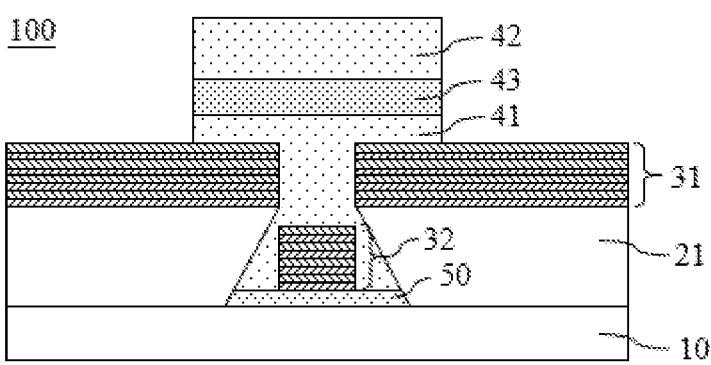
FIG. 8 is a schematic structural diagram of a light emitting device according to an embodiment of the present application.

In an embodiment, FIG. 8 is a schematic structural diagram of a light emitting device according to an embodiment of the present application, as shown in FIG. 8, the light emitting device 100 further includes a third semiconductor layer 50 between the bottom surface, close to the substrate 10, of the second DBR layer 32 and the bottom wall end 22b, and the first semiconductor layer 41 is located on a side, away from the substrate 10, of the third semiconductor layer 50. The second DBR layer 32 is formed on the substrate 10, and the second DBR layer 32 is not in direct contact to the substrate 10, and therefore, a middle layer between the second DBR layer 32 and the substrate 10 is the third semiconductor layer 50.

In an embodiment, a number of cycles of the multi-cycle material of the first DBR layer 31 is the same as that of the second DBR layer 32. The number of cycles refers to a number of DBR material pairs. The first DBR layer 31 and the second DBR layer 32 are formed in a same manufacturing process, and the manufacturing process may be a physical vapor deposition method. The first DBR layer 31 is directly deposited on the first mask layer 21, the second DBR layer 32 is deposited on the substrate 10 through the first window 22, and therefore, the first DBR layer 31 and the second DBR layer 32 may be formed without a two-step manufacturing process, thereby simplifying the process.

Figure 9:
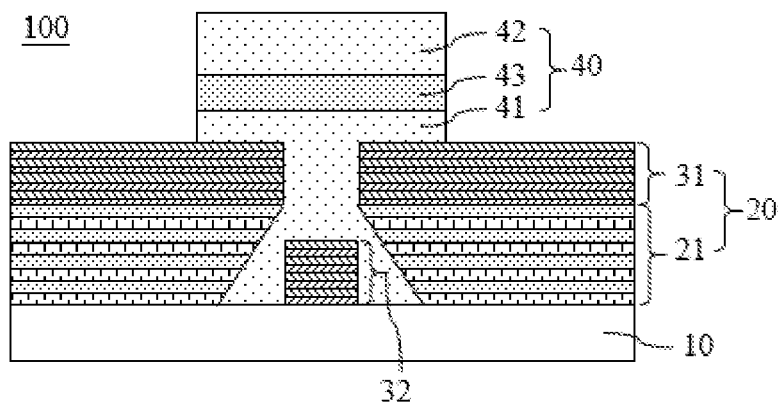
FIG. 9 is a schematic structural diagram of a light emitting device according to an embodiment of the present application.

In an embodiment, FIG. 9 is a schematic structural diagram of a light emitting device according to an embodiment of the present application, as shown in FIG. 9, the first mask layer 21 is a DBR structure, and the DBR structure is made of a multi-cycle material. It should be noted that a number of DBR cycles (i.e., the number of cycles of the multi-cycle material) of the first mask layer 21 may be the same as or different from a number of DBR cycles (i.e., the number of cycles of the multi-cycle material) of the first DBR layer 31. When one cycle material in the multi-cycle material includes two materials, the DBR material pair of the first mask layer 21 may be the same as or different from that of the first DBR layer 31.

Figure 10:
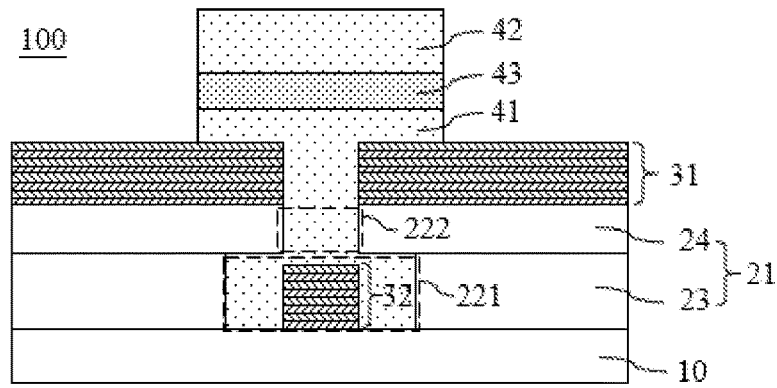
FIG. 10 is a schematic structural diagram of a light emitting device according to an embodiment of the present application.

In an embodiment, FIG. 10 is a schematic structural diagram of a light emitting device according to an embodiment of the present application, as shown in FIG. 10, the first mask layer 21 includes a first sub-mask layer 23 close to the substrate 10 and a second sub-mask layer 24 away from the substrate 10, the first sub-mask layer 23 is provided with a first sub-window 221, the second sub-mask layer 24 is provided with a second sub-window 222, the second sub-window 222 is in communication with the first sub-window 221, at least part of the window 22 is formed by the second sub-window 222 and the first sub-window 221, and on the plane where the substrate 10 is located, an area of an orthographic projection of the second sub-window 222 is less than an area of an orthographic projection of the first sub-window 221.

The first sub-window 221 is in communication with the second sub-window 222, and the area of the projection of the second sub-window 222 on the plane where the substrate 10 is located is relatively small, so that the window 22 is brought together in a direction away from the substrate 10, reducing the dislocation density during epitaxial growth in the window 22.

In one embodiment, mask materials of the first sub-mask layer 23 and the second sub-mask layer 24 are the same. In another embodiment, the mask materials of the first sub-mask layer 23 and the second sub-mask layer 24 are different.

Figure 11:
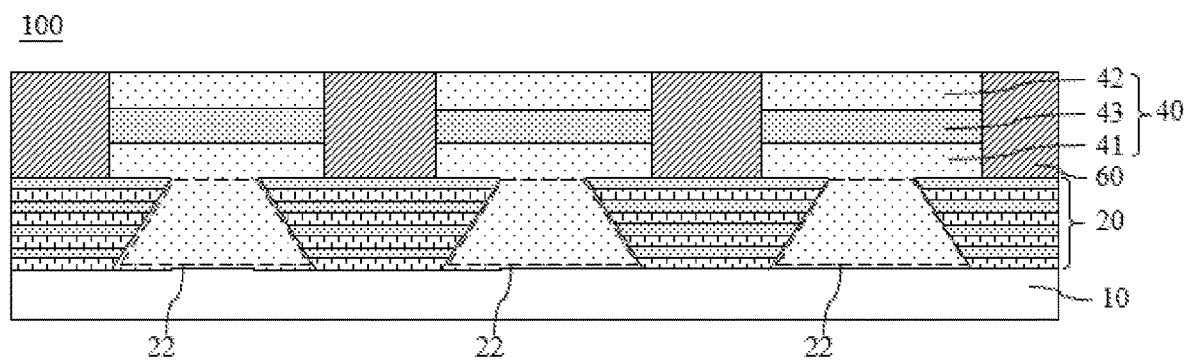
FIG. 11 is a schematic structural diagram of a light emitting device according to an embodiment of the present application.

In an embodiment, FIG. 11 is a schematic structural diagram of a light emitting device according to an embodiment of the present application, as shown in FIG. 11, the DBR mask layer 20 includes a plurality of windows 22, and the plurality of windows 22 are correspondingly provided with a plurality of light emitting units 40. The light emitting device 100 includes the plurality of light emitting units 40, when the light emitting unit 40 includes three primary colors formed by RGB, the light emitting device 100 may be used for direct display; and when the light emitting unit 40 includes only one color, the light emitting device 100 may be used for emitting light of a specific color.

In one embodiment, an isolation structure is formed between at least one pair of the plurality light emitting units. For example, as shown in FIG. 11, the isolation structure 60 is formed between two adjacent light emitting units 40. Arrangement of the isolation structure 60 may be used to block light crosstalk between two light emitting units 40, and may also be used to electrically insulate two light emitting units 40. In one embodiment, a material of the isolation structure 60 includes a black glue material or a photonic crystal.

Figure 12:
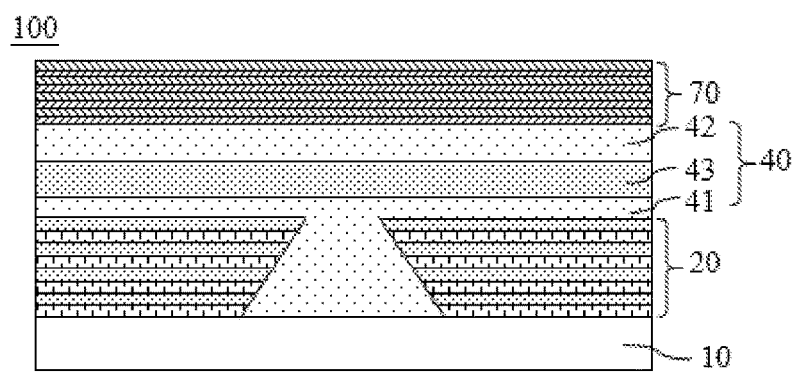
FIG. 12 is a schematic structural diagram of a light emitting device according to an embodiment of the present application.
Figure 13:
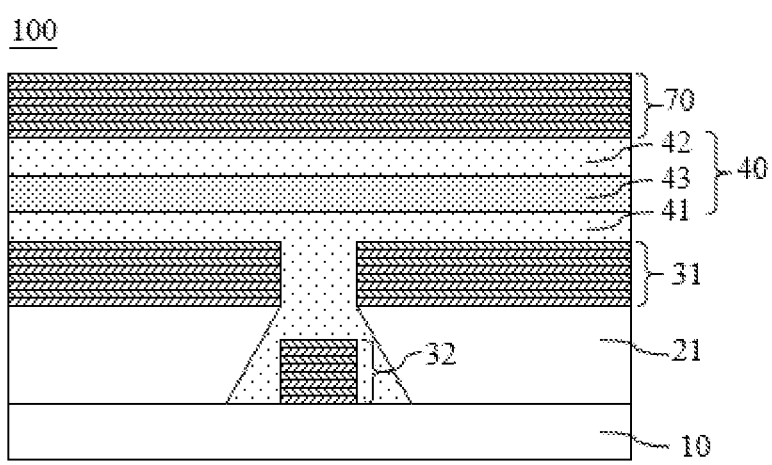
FIG. 13 is a schematic structural diagram of a light emitting device according to an embodiment of the present application.

In one embodiment, FIG. 12 is a schematic structural diagram of a light emitting device according to an embodiment of the present application, and FIG. 13 is a schematic structural diagram of a light emitting device according to an embodiment of the present application, as shown in FIG. 12 and FIG. 13, the light emitting device 100 further includes a third DBR layer 70, and the third DBR layer 70 is located on a side, away from the substrate 10, of the light emitting unit 40. When the light emitting device 100 is a resonant cavity structure, a reflective resonant cavity is formed by the DBR mask layer 20 and the third DBR layer 70, or a reflective resonant cavity is formed by the third DBR layer 70 and an entirety of the first DBR layer 31 and the second DBR layer 32.

An embodiment of the present application further provides a terminal device, including the light emitting device according to any one of the above embodiments. Beneficial effects brought by the terminal device are the same as the beneficial effects brought by the light emitting device, details are not described herein again, and please refer to the above embodiments for details.

The present application provides a light emitting device and a method for manufacturing the same, a terminal device, the light emitting device includes: a substrate; a DBR mask layer on a side of the substrate, the DBR mask layer being provided with a window exposing the substrate, the window including an opening end away from the substrate and a bottom wall end close to the substrate, and on a plane where the substrate is located, an orthographic projection of the opening end falling within an orthographic projection of the bottom wall end; and a light emitting unit. The light emitting unit includes a first semiconductor layer, an active layer and a second semiconductor layer which are stacked sequentially, a position relationship between the first semiconductor layer and the window includes at least one of the followings: the first semiconductor layer being located in the window or the first semiconductor layer being located on a side, away from the substrate, of the window, the active layer is located on a side, away from the substrate, of the DBR mask layer, the second semiconductor layer is located on a side, away from the substrate, of the active layer, and a conductivity type of the first semiconductor layer is opposite to that of the second semiconductor layer. Providing the window on the DBR mask layer may reduce the dislocation density during the epitaxial growth of the light emitting unit, and the arrangement of the DBR mask layer may improve the light extraction efficiency of the light emitting device.

It should be understood that the term "include" and variations thereof used in this application are open-ended, that is, "including but not limited to". The term "one embodiment" represents "at least one embodiment"; and the term "another embodiment" represents "at least one further embodiment". In this specification, a schematic representation of the above terms does not have to be directed to the same embodiment or example. Furthermore, the specific features, structures, materials, or characteristics described may be combined in any suitable manner in any one or more embodiments or examples. In addition, in the case of no contradiction, a person skilled in the art may combine and constitute different embodiments or examples described in this specification and features of different embodiments or examples.

The foregoing descriptions are merely preferred embodiments of the present application, and are not intended to limit the present application, and any modification, equivalent replacement, etc. made within the spirit and principles of the present application should be included within the protection scope of the present application.

What is claimed is:

1. A light emitting device, comprising:
    a substrate;
    a distributed bragg reflector (DBR) mask layer on a side of the substrate, the DBR mask layer being provided with a window exposing the substrate, the window comprising an opening end away from the substrate and a bottom wall end close to the substrate, and on a plane where the substrate is located, an orthographic projection of the opening end falling within an orthographic projection of the bottom wall end; and
    a light emitting unit, wherein the light emitting unit comprises a first semiconductor layer, an active layer and a second semiconductor layer which are stacked sequentially, a position relationship between the first semiconductor layer and the window comprises at least one of the followings: the first semiconductor layer being located in the window or the first semiconductor layer being located on a side, away from the substrate, of the window, the active layer is located on a side, away from the substrate, of the DBR mask layer, the second semiconductor layer is located on a side, away from the substrate, of the active layer, and a conductivity type of the first semiconductor layer is opposite to that of the second semiconductor layer.

2. The light emitting device according to claim 1, wherein a cross-sectional area of at least part of the window gradually decreases in a direction from the substrate to the opening end.

3. The light emitting device according to claim 1, wherein along a plane perpendicular to the substrate, a cross-section of the window is formed by a first side, a second side, a third side and a fourth side which are connected in sequence, the first side is located on the opening end, the third side is located on the bottom wall end, a sidewall of the window is formed by the second side and the fourth side, the second side is formed by one or a combination of a straight line or a curve, and the fourth side is formed by one or a combination of a straight line or a curve.

4. The light emitting device according to claim 1, wherein the DBR mask layer comprises: a first mask layer and a first DBR layer which are stacked sequentially, and the first DBR layer is located on a side, away from the substrate, of the first mask layer;
    the window comprises a first window exposing the substrate; and
    the first window is formed by the first mask layer and comprises a first window opening end away from the substrate and a first window bottom wall end close to the substrate, and on the plane where the substrate is located, an orthographic projection of the first window opening end falls within an orthographic projection of the first window bottom wall end.

5. The light emitting device according to claim 4, wherein in a direction from the substrate to the opening end, a cross-sectional area of the first window gradually decreases, and a cross-sectional area of the window gradually decreases and then remains unchanged.

6. The light emitting device according to claim 4, wherein the DBR mask layer further comprises: a second DBR layer, the second DBR layer is located in the first window, and on the substrate, an orthographic projection of the second DBR layer at least partially overlaps an orthographic projection of the first window opening end.

7. The light emitting device according to claim 6, wherein on the substrate, an orthographic projection of the first window is completely covered by a combination of orthographic projections of the first DBR layer and the second DBR layer.

8. The light emitting device according to claim 6, wherein a bottom surface, close to the substrate, of the second DBR layer and the bottom wall end are located in a same plane.

9. The light emitting device according to claim 6, further comprising: a third semiconductor layer between a bottom surface, close to the substrate, of the second DBR layer and the bottom wall end,
    wherein the first semiconductor layer is located on a side, away from the substrate, of the third semiconductor layer.

10. The light emitting device according to claim 6, wherein each of the first DBR layer and the second DBR layer is made of a multi-cycle material, and a number of cycles of the multi-cycle material of the first DBR layer is the same as that of the second DBR layer.

11. The light emitting device according to claim 6, wherein the multi-cycle material selected for the first DBR layer is different from that for the second DBR layer.

12. The light emitting device according to claim 4, wherein the first mask layer is a DBR structure.

13. The light emitting device according to claim 4, wherein the first mask layer comprises a first sub-mask layer close to the substrate and a second sub-mask layer away from the substrate, the first sub-mask layer is provided with a first sub-window, the second sub-mask layer is provided with a second sub-window, the second sub-window is in communication with the first sub-window, at least part of the window is formed by the second sub-window and the first sub-window, and on the plane where the substrate is located, an area of an orthographic projection of the second sub-window is less than that of the first sub-window.

14. The light emitting device according to claim 1, wherein the DBR mask layer comprises a plurality of windows, and the plurality of windows are correspondingly provided with a plurality of light emitting units.

15. The light emitting device according to claim 14, wherein an isolation structure is disposed between at least one pair of the plurality light emitting units.

16. The light emitting device according to claim 1, further comprising a third DBR layer on a side, away from the substrate, of the light emitting unit.

17. A method for manufacturing a light emitting device, comprising:
    providing a substrate;
    preparing a DBR mask layer on the substrate;
    forming a window in the DBR mask layer by using multi-angle dry etching, an angle between an etching direction of the multi-angle dry etching and a plane where the substrate is located being an acute angle; and epitaxially growing a light emitting unit at the window, wherein the substrate is exposed by the window, the window comprises an opening end away from the substrate and a bottom wall end close to the substrate, and on the plane where the substrate is located, an orthographic projection of the opening end falls within an orthographic projection of the bottom wall end; and the light emitting units comprises a first semiconductor layer, an active layer, and a second semiconductor layer which are stacked sequentially, a position relationship between the first semiconductor layer and the window comprises at least one of the followings: the first semiconductor layer being located in the window or the first semiconductor layer being located on a side, away from the substrate, of the window, the active layer is located on a side, away from the substrate, of the DBR mask layer, the second semiconductor layer is located on a side, away from the substrate, of the active layer, and a conductivity type of the first semiconductor layer is opposite to that of the second semiconductor layer.

18. A terminal device, comprising: a light emitting device, wherein the light emitting device comprises:

a substrate;

a DBR mask layer on a side of the substrate; the DBR mask layer being provided with a window exposing the substrate, the window comprises an opening end away from the substrate and a bottom wall end close to the substrate, and on a plane where the substrate is located, an orthographic projection of the opening end falling within an orthographic projection of the bottom wall end; and a light emitting unit, wherein the light emitting unit comprises a first semiconductor layer, an active layer and a second semiconductor layer which are stacked sequentially, a position relationship between the first semiconductor layer and the window comprises at least one of the followings: the first semiconductor layer being located in the window or the first semiconductor layer being located on a side, away from the substrate, of the window, the active layer is located on a side, away from the substrate, of the DBR mask layer, the second semiconductor layer is located on a side, away from the substrate, of the active layer, and a conductivity type of the first semiconductor layer is opposite to that of the second semiconductor layer.

19. The terminal device according to claim 18, wherein a cross-sectional area of at least part of the window gradually decreases in a direction from the substrate to the opening end.

20. The terminal device according to claim 18, wherein the DBR mask layer comprises: a first mask layer and a first DBR layer which are stacked sequentially, the first DBR layer is located on a side, away from the substrate, of the first mask layer;

the window comprises a first window exposing the substrate; and the first window is formed by the first mask layer and comprises a first window opening end away from the substrate and a first window bottom wall end close to the substrate, and on the plane where the substrate is located, an orthographic projection of the first window opening end falls within an orthographic projection of the first window bottom wall end.

* * * * *